United States Patent
Chen et al.

(10) Patent No.: US 7,359,248 B2
(45) Date of Patent: Apr. 15, 2008

(54) METHODS FOR PROGRAMMING AND READING NAND FLASH MEMORY DEVICE AND PAGE BUFFER PERFORMING THE SAME

(75) Inventors: Chung Zen Chen, Hsinchu (TW); Jo Yu Wang, Hsinchu (TW); Fu An Wu, Hsinchu (TW)

(73) Assignee: Elite Semiconductor Memory Technology Inc, Taiwan (CN)

( * ) Notice: Subject to any disclaimer, the term of this patent is extended or adjusted under 35 U.S.C. 154(b) by 0 days.

(21) Appl. No.: 11/481,022

(22) Filed: Jul. 6, 2006

(65) Prior Publication Data

US 2008/0008008 A1    Jan. 10, 2008

(51) Int. Cl.
  *G11C 11/34* (2006.01)
(52) U.S. Cl. ............... 365/185.22; 365/185.24
(58) Field of Classification Search ........... 365/185.22, 365/185.24
  See application file for complete search history.

(56) References Cited

U.S. PATENT DOCUMENTS

| | | | | |
|---|---|---|---|---|
| 6,091,631 A | * | 7/2000 | Kucera et al. | 365/185.03 |
| 6,442,074 B1 | * | 8/2002 | Hamilton et al. | 365/185.29 |
| 6,512,701 B1 | * | 1/2003 | Hamilton et al. | 365/185.29 |
| 6,671,204 B2 | | 12/2003 | Im | |
| 6,937,510 B2 | | 8/2005 | Hosono et al. | |
| 7,035,144 B2 | * | 4/2006 | Kim et al. | 365/185.18 |
| 2005/0018488 A1 | | 1/2005 | Kin et al. | |
| 2007/0035995 A1 | * | 2/2007 | Crippa et al. | 365/185.03 |

* cited by examiner

*Primary Examiner*—Michael T Tran
(74) *Attorney, Agent, or Firm*—Oliff & Berridge, PLC

(57) ABSTRACT

Methods for programming and reading a multi-level-cell NAND flash memory device having plural memory cells are disclosed to reduce the programming time and the reading time. The program method comprises the steps of: (a) programming the zero state memory cells, the first state memory cells, the second state memory cells and the third state memory cells to a zero state, (b) programming the second state memory cells from the zero state to a second state by switching the MSBs of the second state memory cells, and (c) programming the first state memory cells from the zero state to a first state by switching the LSBs of the first state memory cells and simultaneously programming the third state memory cells from the second state to a third state by switching the LSBs of the third state memory cells. The read method comprises the steps of: (d) reading the MSBs of the zero state memory cells, the first state memory cells, the second state memory cells, and the third state memory cells by a first verify signal and a second verify signal, and (e) reading the LSBs of the zero state memory cells, the first state memory cells, the second state memory cells, and the third state memory cells by the first verify signal and a third verify signal. A page buffer is also disclosed to perform the methods for programming and reading a multi-level-cell NAND flash memory device.

18 Claims, 10 Drawing Sheets

METHODS FOR PROGRAMMING AND READING NAND FLASH MEMORY DEVICE AND PAGE BUFFER PERFORMING THE SAME

BACKGROUND OF THE INVENTION

1. Field of the Invention

The present invention relates to methods for programming and reading a NAND flash memory device and a page buffer performing the same, and more particularly, to methods for programming and reading a multi-level-cell NAND flash memory device and a page buffer performing the same.

2. Description of the Related Art

In a traditional NAND flash memory device, memory cells can take one of two information storing states, namely, the "ON" state and the "OFF" state. One bit of information is defined by the ON or OFF state of a respective memory cell. In order to store data of N bits (N: a positive integer of 2 or greater) in the aforesaid traditional NAND flash memory device, N independent memory cells are necessary. When it is required to increase the number of bits of data to be stored in a NAND flash memory device having one-bit memory cells, the number of such memory cells should increase accordingly. Information stored in the one-bit memory cell is determined by the programmed status of the memory cell where programming is used to store the desired information in the memory cell. The information storing state of the memory cell is determined by the threshold voltage which is a minimum voltage to be applied between the gate and source terminals of the transistor included in the memory cell to switch the cell transistor to its ON state.

To increase the storage capacity without increasing the number of memory cells, information stored in the memory cell can be increased to more than two states in one memory cell, instead of the above mentioned "ON-OFF, two state" memory cell. Such a multi-level cell stores more than one bit information. The most commonly used such memory cell has 2 bits of information in one memory cell, in which 4 distinctly different states need to be defined, normally by the threshold voltage definition described as follows.

FIG. 1 shows a threshold voltage distribution of a memory cell according to programmed data, in which the programmed data exhibits one of a threshold voltage (indicating 2-bit data of (11)) lower than −2.0V, a threshold voltage (indicating 2-bit data of (10)) between 0.3V to 0.7V, a threshold voltage (indicating 2-bit data of (01)) between 1.3V to 1.7V, and a threshold voltage (indicating 2-bit data of (00)) between 2.3V to 2.7V. Data can be stored in four different states in one memory cell on the basis of such threshold voltage distributions.

FIG. 2 shows two strings in a memory cell array 20 of a NAND flash memory device, where each memory cell 10 stores two-bit information. The memory cell array 20 comprises plural memory cells 10 connected in series between a bit line (BL1 or BL2) and a ground select line GSL. A group of memory cells 10 connected in series to one bit line (BL1 or BL2) along with select transistors (a string select transistor SST and a ground select transistor GST) used to select the memory cells 10 is called a string. The string select transistor SST is selectively switched on to couple the associated string and the bit line together. The ground select transistor GST is selectively switched the connection between each string and a common source line CSL.

As for the program operation and the read operation applied in a multi-level-cell NAND flash memory device, some traditional program methods are given as follows. U.S. Pat. No. 2005/0018488, herein incorporated by reference and hereinafter '488, discloses a method to program the memory cell with two pages of data. One page of data is programmed to the LSBs (least significant bit) of the memory cells and another page of data is programmed to the MSBs (most significant bit) of the memory cells. FIG. 3 shows the state transition of the memory cells of the program operation in '488. Referring to FIG. 3, the LSBs of the memory cells are programmed first from the (11) state to the (11) state, or to the (10) state as indicated by a pointer A, in a page program. Then, the MSBs of the memory cells are programmed in another page program. In the MSB program, the memory cells in the (11) state will be programmed to the (11) state, or to the (01) state as indicated by a pointer B1, and the memory cells in the (10) state will be programmed to the (00) state as indicated by a pointer B2. The B1 and B2 MSB programs occur simultaneously. The bit line voltage level is 0V for the B1 MSB program; however, the B2 MSB program is slowed down by tuning the bit line voltage level between 0V and a source voltage (e.g. $V_{cc}$) to fit the programming time of the B1 MSB program. A method to read the memory cells is disclosed in '488, which includes a two-phase LSB read and a one-phase MSB read. The two-phase LSB read comprises the LSB1 read and the LSB2 read. The voltages $V_{rd3}$, $V_{rd1}$, and $V_{rd2}$ are applied to the selected word line in the LSB1 read, the LSB2 read, and the MSB read, respectively. Note that the relation of $V_{rd3} > V_{rd2} > V_{rd1}$ exists, as shown in FIG. 3.

U.S. Pat. No. 6,937,510, herein incorporated by reference and hereinafter '510, discloses a method to program the memory cell with two pages of data. Referring to FIG. 4, a memory cell has four possible levels, (0), (1), (2), and (3), which shows the state transition of the memory cells of the program operation in '510. The threshold voltage distribution of FIG. 4 is similar to that of FIG. 3. In FIG. 4, the LSBs of the memory cells are programmed from the (0) state to the (0) state, or to the (1) state as indicated by a pointer C, in a page program. Then, the MSBs of the memory cells are programmed in another page program. In the MSB program, the memory cells in the (0) state are programmed to the (0) state, or to the (2) state as indicated by a pointer D1, and the memory cells in the (1) state will be programmed to the (1) state, or to the (3) state as indicated by a pointer D2. The D1 and D2 MSB programs occur simultaneously. The bit line voltage level is 0V for the D2 MSB program; however, the D1 MSB program is slowed down by tuning the bit line voltage level between 0V and a source voltage (e.g. $V_{cc}$) to fit the programming time of the D2 MSB program. A method to read the memory cells is disclosed in '510, which employs a three-phase read to distinguish the four levels of (0), (1), (2), and (3) with the voltages of $V_{rd3}$, $V_{rd2}$, and $V_{rd1}$ applied to the selected word line, respectively. Note that the relation of $V_{rd3} > V_{rd2} > V_{rd1}$ exists, as shown in FIG. 4.

SUMMARY OF THE INVENTION

The first objective of the present invention is to provide a method for programming a multi-level-cell NAND flash memory device, which programs the MSBs of memory cells first and followed by the LSBs of the memory cells, to reduce the programming time.

The second objective of the present invention is to provide a method for reading a multi-level-cell NAND flash memory device, which performs a three-phase LSB read and a one-phase MSB read, to reduce the reading time.

The third objective of the present invention is to provide a page buffer to perform the methods for programming and reading the multi-level-cell NAND flash memory device, so that the programming time and the reading time are reduced.

In order to achieve the objectives, methods for programming and for reading a multi-level-cell NAND flash memory device and a pager buffer performing the same are disclosed. The method for programming a multi-level-cell NAND flash memory device having zero state memory cells, first state memory cells, second state memory cells and third state memory cells comprises: (a) programming the zero state memory cells, the first state memory cells, the second state memory cells, and the third state memory cells to a zero state, (b) programming the second state memory cells from the zero state to a second state by switching the MSBs of the second state memory cells, and (c) programming the first state memory cells from the zero state to a first state by switching the LSBs of the first state memory cells and simultaneously programming the third state memory cells from the second state to a third state by switching the LSBs of the third state memory cells. Note that each of the zero state memory cells, the first state memory cells, the second state memory cells, and the third state memory cells is associated with a first latch circuit and a second latch circuit.

The method for reading a multi-level-cell NAND flash memory device having zero state memory cells, first state memory cells, second state memory cells, and third state memory cells, comprises: (a) reading the MSBs of the zero state memory cells, the first state memory cells, the second state memory cells, and the third state memory cells by a first verify signal and a second verify signal, and (b) reading the LSBs of the zero state memory cells, the first state memory cells, the second state memory cells, and the third state memory cells by the first verify signal and a third verify signal, wherein the first verify signal and the second verify signal are applied to the first latch circuit, and the third verify signal is applied to the second latch circuit. Note that each of the zero state memory cells, the first state memory cells, the second state memory cells, and the third state memory cells is associated with a first latch circuit and a second latch circuit.

Note that the zero state memory cells, the first state memory cells, the second state memory cells, and the third state memory cells mentioned above indicate the memory cells to be programmed to the (11), (10), (01), and (00) states, respectively.

The present invention also discloses a page buffer performing the methods for programming and for reading a multi-level-cell NAND flash memory device. The page buffer of the present invention comprises a first latch circuit, a second latch circuit, a bit line voltage supply circuit, an input circuit and a precharge circuit. The first latch circuit is used to verify the memory cells by a first verify signal and a second verify signal. The second latch circuit is used to read the LSBs of the memory cells by a third verify signal. The bit line voltage supply circuit is used to provide a bit line power to a selected bit line associated with the memory cells to be programmed. The input circuit is used to receive the information to be programmed to the memory cells. The precharge circuit is used to precharge the selected bit line.

BRIEF DESCRIPTION OF THE DRAWINGS

The invention will be described according to the appended drawings in which.

DETAILED DESCRIPTION OF THE INVENTION

Figure 1:
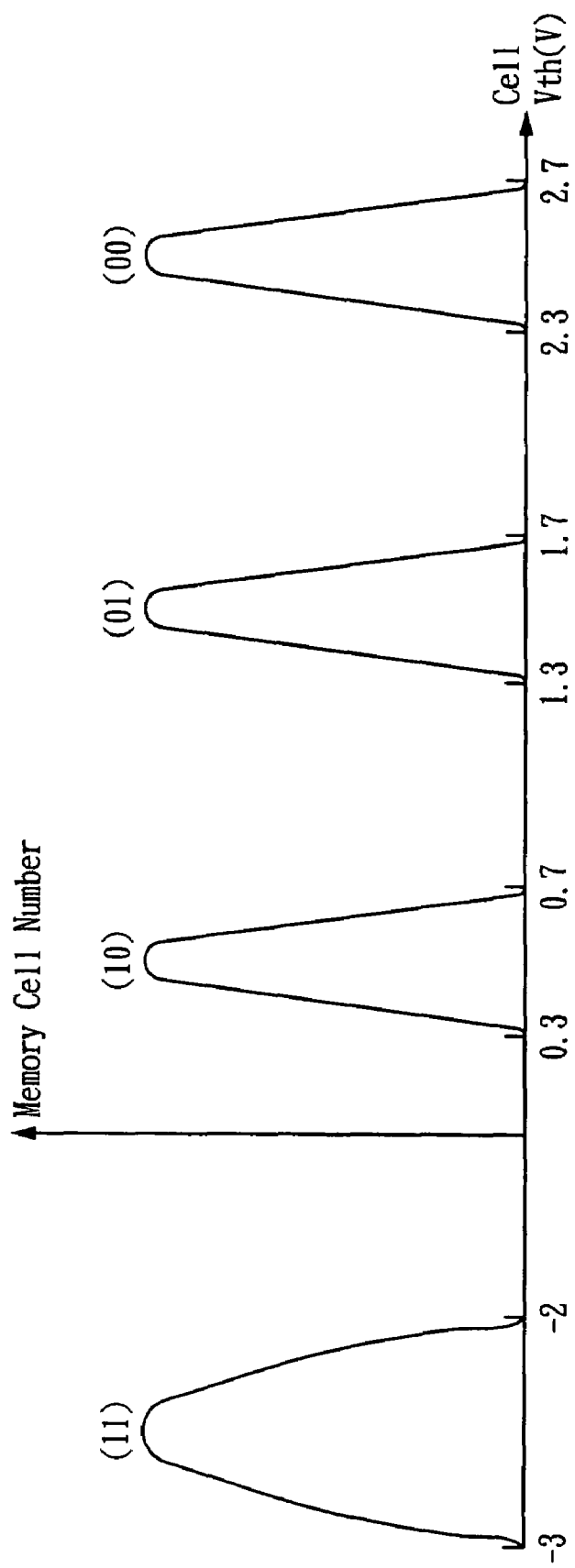
FIG. 1 shows a threshold voltage distribution of a memory cell according to programmed data.
Figure 2:
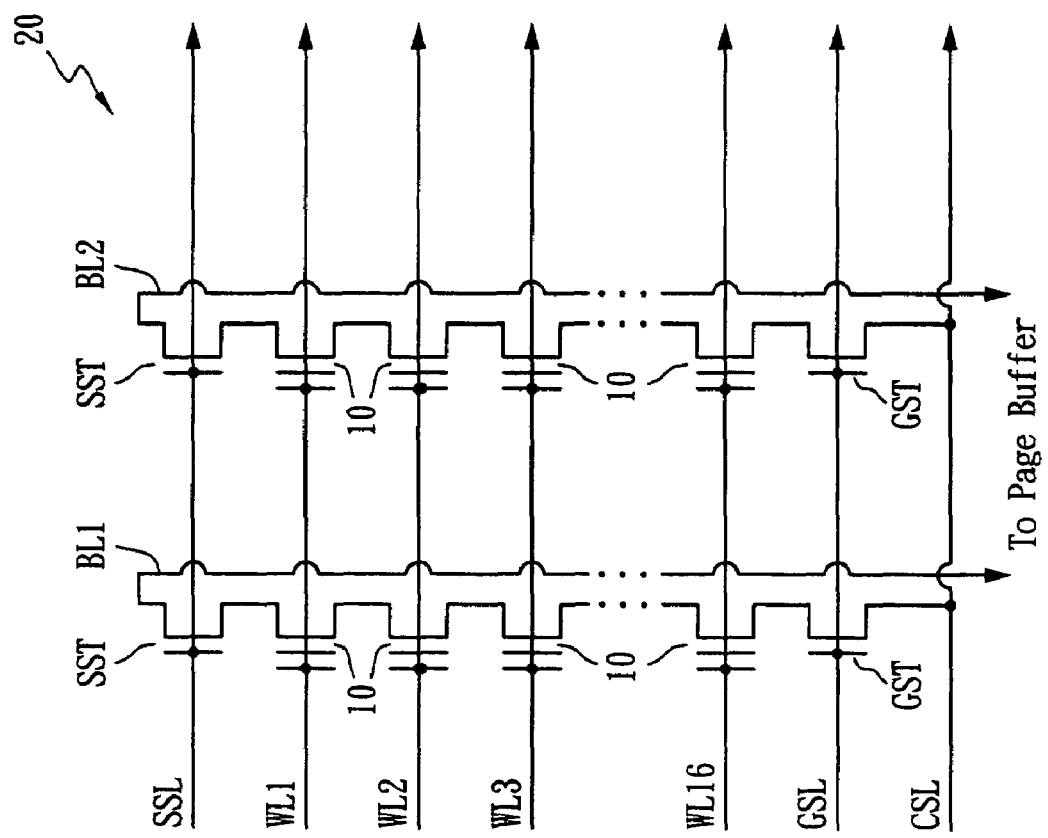
FIG. 2 shows two strings in a memory cell array of a NAND flash memory device.
Figure 3:
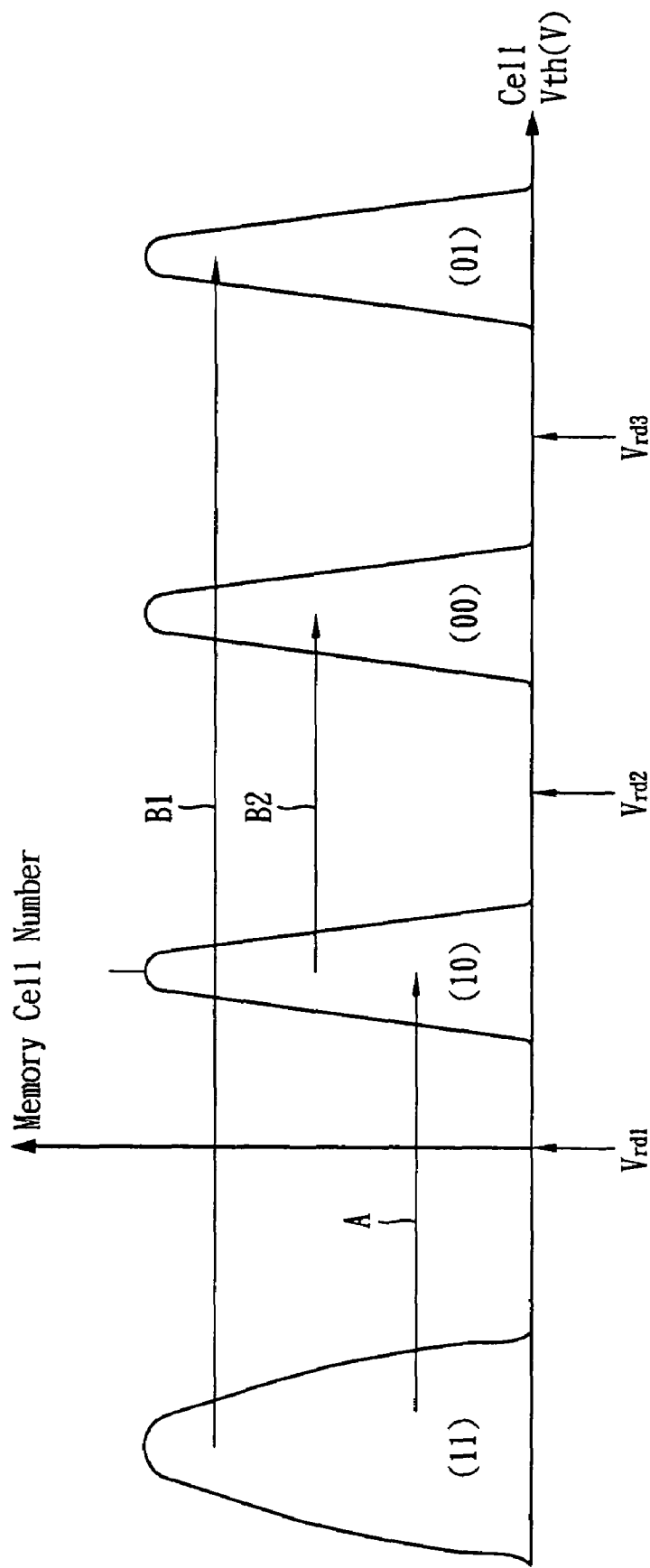
FIG. 3 shows the state transition of the memory cells of the program operation in a prior art.
Figure 4:
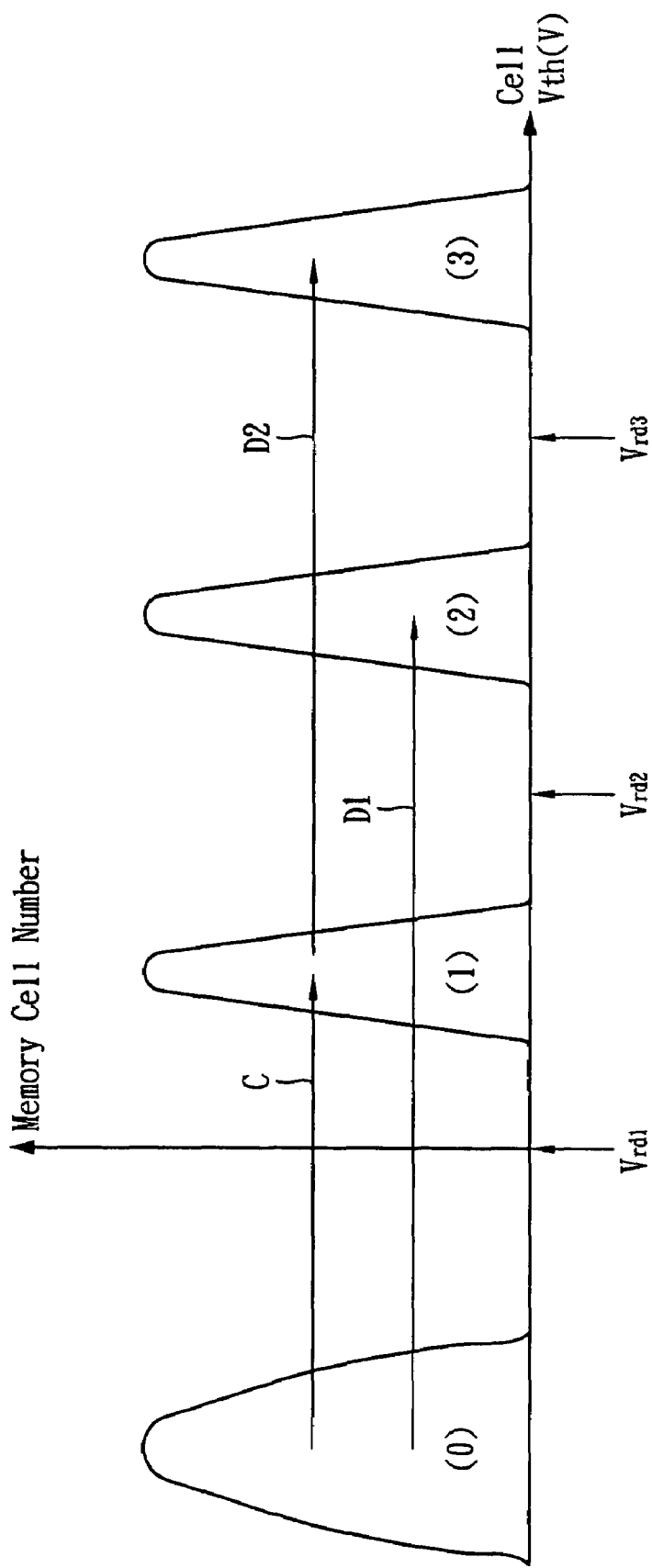
FIG. 4 shows the state transition of the memory cells of the program operation in another prior art.
Figure 5:
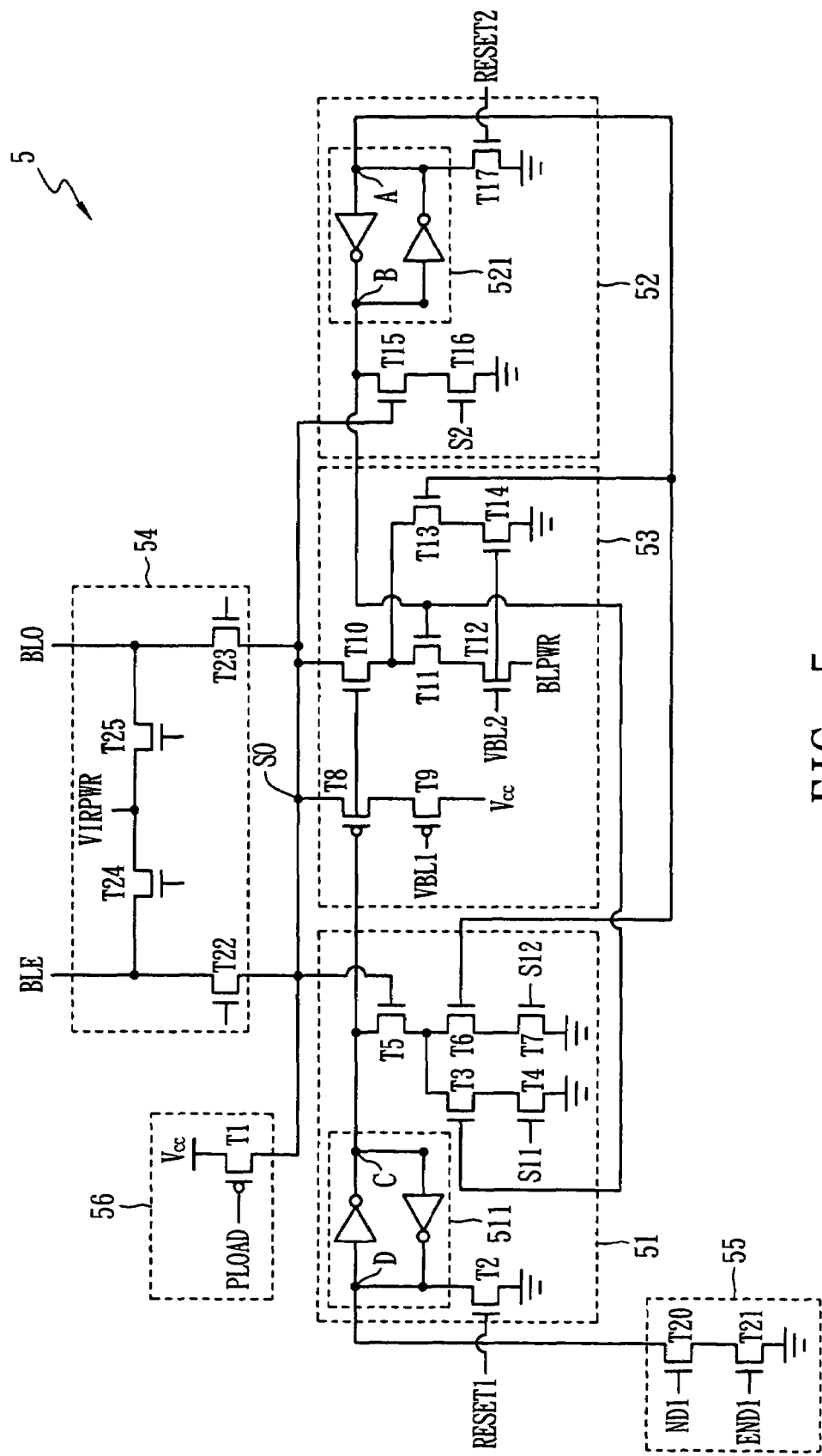
FIG. 5 shows the circuit of the page buffer in accordance with an embodiment of the present invention.

FIG. 5 shows the circuit of one embodiment of the page buffer 5 of the present invention. The page buffer 5 comprises a first latch circuit 51, a second latch circuit 52, a bit line voltage supply circuit 53, an input circuit 55, a precharge circuit 56 and a bit line selection circuit 54.

Figure 6:
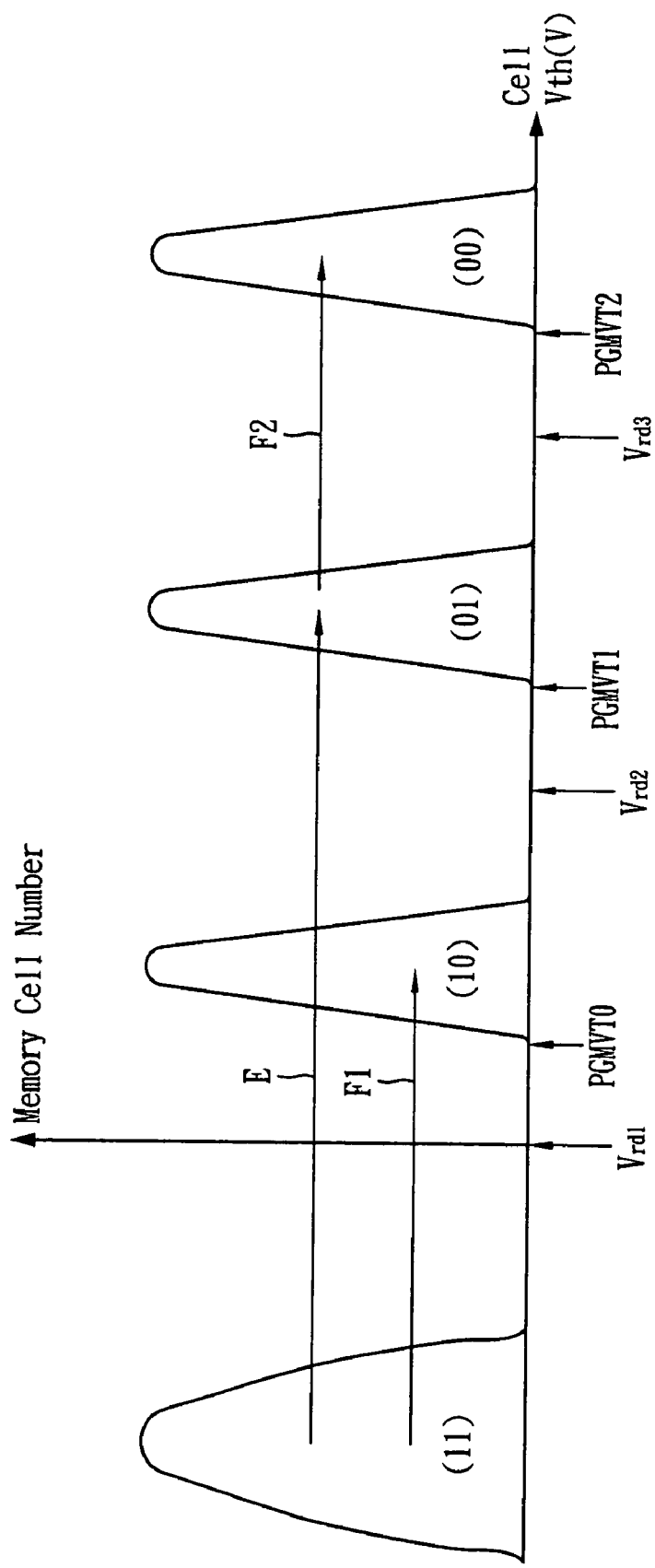
FIG. 6 shows the state transition of the memory cells of the program operation of the present invention.

FIG. 6 shows the state transition of the memory cells of the two-page program method of the present invention. In the current embodiment, the read voltages of $V_{rd1}$, $V_{rd2}$, and $V_{rd3}$ applied to the selected word line can be 0V, 1V, and 2V, respectively. The program voltages of PGMVT0, PGMVT1, and PGMVT2 applied to the selected word line can be 0.3V, 1.3V, and 2.3V, respectively, which are also called a first program voltage, a second program voltage, and a third program voltage. The zero, first, second, and third states represent the (11), (10), (01), and (00) states in FIG. 6, respectively. Also, the zero state memory cells, the first state memory cells, the second state memory cells, and the third state memory cells are indicative of the memory cells to be programmed to the zero, the first, the second, and the third states, respectively.

Referring to FIGS. 5 and 6, for the first page program, i.e., the MSB program indicated by a pointer E in FIG. 6, nodes C and D of first latch circuit 51, and nodes B and A of the second latch circuit 52 are respectively set to a low state, a high state, a high state, and a low state before data input. The node A in the low state is set by actuating the signal RESET2 to turn on the NMOS transistor T17. The node C in the low state is set by actuating the signal PLOAD to a low state to turn on the PMOS transistor T1 and actuating a first verify signal S11 to turn on the NMOS transistor T4. Accordingly, the node SO is pulled to a high state and the NMOS transistors T5, T3, and T4 are turned on to set the node C to a low state. During data input, the signal ENDI remains in a high state. If the data input is "0" (i.e., a low state and thus the signal NDI is in a high state), the NMOS transistors T20 and T21 are turned on, resulting in the nodes D and C in a low state and a high state, respectively. If the data input is "1" (i.e., a high state and thus the signal NDI is in low state), the NMOS transistor T20 is turned off, resulting in the node C in a low state. Afterward, the signals VBL1 and VBL2 are set to a low state and a high state, respectively, to turn on the PMOS transistor T9 and the NMOS transistor T12. During the MSB program, the data input of "0" causes the node C to be in a high state, and the NMOS transistors T10, T11, and T12 are turned on. Therefore, the node SO is pulled to a bit line power BLPWR that is at $V_{ss}$ level (e.g., a ground voltage) during the MSB program. The node SO is connected to the bit line BLE by turning on the NMOS transistor T22, and thus the bit line BLE is at $V_{ss}$ level, too. Consequently, the program operation is allowed. Note that another bit line BL0, which is grounded, acts as a shielding bit line in the current embodiment. However the data input of "1" causes the node C to be in a low state, and the PMOS transistors T8 and T9 are turned on. Then, the node SO is pulled to $V_{cc}$ level (e.g., a source voltage) and thus the bit line BLE is at $V_{cc}$ level. Consequently, the program operation is prohibited. Note that the MSBs of the second state memory cells, the LSBs of the first state memory cells, and the LSBs of the third state memory cells are switched from a high state (i.e., "1") to a low state (i.e., "0").

Figure 7:
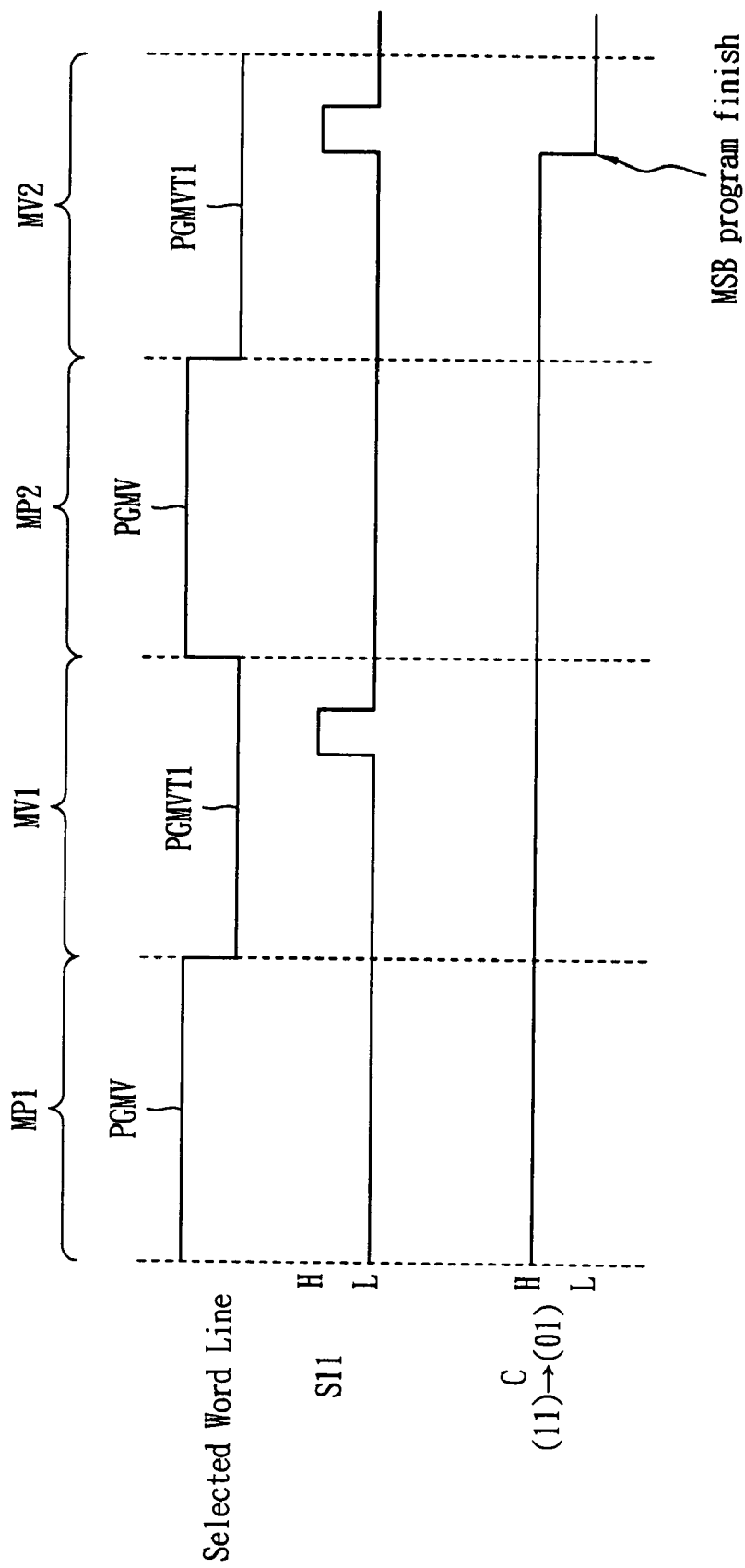
FIG. 7 shows the timing chart regarding the MSB program.

FIG. 7 is the timing chart of the selected word line voltage, a first verify signal S11, and the state of the node C (of FIG. 5) during the MSB program, which shows two program periods (MP1 and MP2) and two verify periods (MV1 and MV2). In period MP1, a program voltage of PGMV (e.g., 19V which is larger than PGMVT0, PGMVT1 or PGMVT2 in FIG. 6) is applied to the selected word line associated with the accessed memory cells of which MSBs are being programmed. The first verify signal S11 is active to sense the state of the accessed cell with the program voltage of PGMVT1 (e.g., 1.3V), as shown in periods MV1 and MV2. The node C remaining in a high state during period MV1 means that the MSB program is not completed. Thus, the program operation continues in period MP2. In period MV2, the threshold voltage of the accessed memory cell reaches the desired level (i.e., MSB program finish) and then the node C switches from a high state to a low state when the first verify signal S11 is active. When the (01) state is achieved (i.e., "1" of the MSB of the (11) state switches to "0" of the MSB of the (01) state), the node SO will be kept in a high state and thus the node C is set to a low state.

The second page program, i.e., the LSB program, is performed with the same word line or accessed memory cells in the MSB program. Referring to FIGS. 5 and 6, the nodes A, B, C, and D are set as the initial settings in the MSB program. During data input, the signal ENDI remains in a high state. If the data input is "0" (i.e., a low state and thus the signal NDI is in a high state, the NMOS transistors T20 and T21 are turned on, resulting in the nodes D and C in a low state and a high state, respectively. If the data input is "1" (i.e., a high state and thus the signal NDI is in low state), the NMOS transistor T20 is turned off, resulting in the node C in a low state. Meanwhile, the read voltage of $V_{rd1}$ or $V_{rd2}$, which is below the threshold voltage distribution of the (01) state, is applied to the selected word line and a third verify signal S2 is active to sense the accessed memory cell. If the accessed memory cell is in the (11) state, the node SO is in a low state and thus the node B remains in a high state. If the accessed memory cell is in the (01) state, the node SO is in a high state and thus the node B switches to a low state. Accordingly, the MSB information of the second state memory cells is read out to the second latch circuit 52 and latched therein. That is, the MSB information of the accessed memory cells in the (11) state (i.e., the zero state) and in the (01) state (i.e., the second state) is latched in the second latch circuit 52. Then, the signal VBL1 and VBL2 are set to a low state and a high state, respectively, so as to turn on the PMOS transistor T9 and the NMOS transistor T12.

The LSB program can be further divided into two portions, the LSB1 program and the LSB2 program, which are indicated by pointers F1 and F2 in FIG. 6, respectively. During the LSB1 program, the data input of "0" will cause the node C to be in a high state. If the accessed memory cell is in the (11) state, the node B remains in a high state and the NMOS transistors T10, T11, and T12 are turned on. The node SO is pulled to the bit line power BLPWR. Since the node SO is connected to the bit line BLE when the NMOS transistor T22 is turned on, and thus the bit line BLE is at the voltage level of the bit line power BLPWR that is tuned between the $V_{ss}$ level (e.g., a ground voltage) and the $V_{cc}$ level (i.e., a source voltage) to slow down the programming speed from the (11) state to the (10) state as indicated by the pointer F1 to fit the programming time from the (01) state to the (00) state as indicated by the pointer F2. The LSB1 program is performed until the accessed memory cell reaches the (10) state. During the LSB2 program, the data input of "0" will cause the node C to be in a high state. If the accessed memory cell is in the (01) state, the node B is in a low state and the NMOS transistors T10, T13, and T14 are turned on. The node B is pulled to the ground voltage and thus the bit line BLE is pulled to the ground voltage, too. The LSB2 program is completed when the accessed memory cell reaches the (00) state. Note that if the data input is "1" during the LSB program, the node C is in a low state. Referring to FIG. 5, the PMOS transistors T8 and T9 are turned on. Consequently, the node SO is pulled to the source voltage $V_{cc}$ and thus the bit line BLE is pulled to the source voltage $V_{cc}$, too. Therefore, the LSB program is prohibited.

Figure 8:
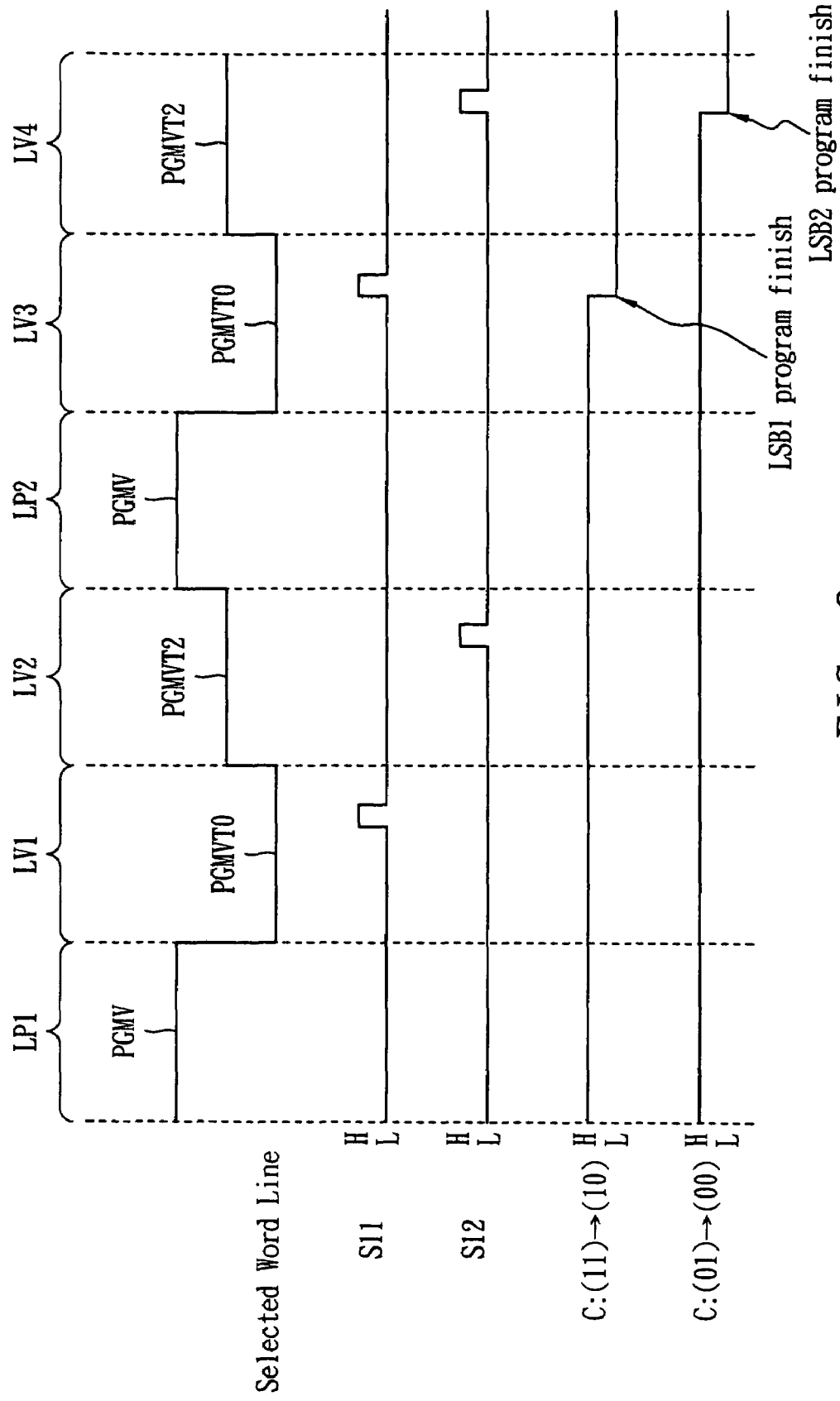
FIG. 8 shows the timing chart regarding the LSB program.

FIG. 8 is the timing chart of the selected word line voltage, the first verify signal S11, a second verify signal S12, and the states of the node C during the LSB program. A two-phase verification (e.g., periods LV1 and LV2, or periods LV3 and LV4) is needed to verify the LSB1 program (e.g. period LV1 or LV3) and the LSB2 program (e.g., period LV2 or LV4). For the verification of the LSB1 program, the program voltage of PGMVT0 (e.g., 0.3V) is applied to the selected word line, and the first verify signal S11 is active to sense the state of the accessed memory cells since the node B is in a high state. For the verification of the LSB2 program (e.g., period LV2 or LV4), the program voltage of PGMVT2 (e.g., 2.3V) is applied to the selected word line, and the second verify signal S12 is active to sense the state of the accessed memory cells since the node A is in a high state. When the (10) and the (00) states are reached, the node C is set to a low state and thus further programming is prohibited. Note that the program voltage of PGMV (e.g., 19V) is applied to the selected word line during periods LP1 and LP2, so that the LSB1 program and the LSB2 program are performed simultaneously during each of periods LP1 and LP2.

Figure 9:
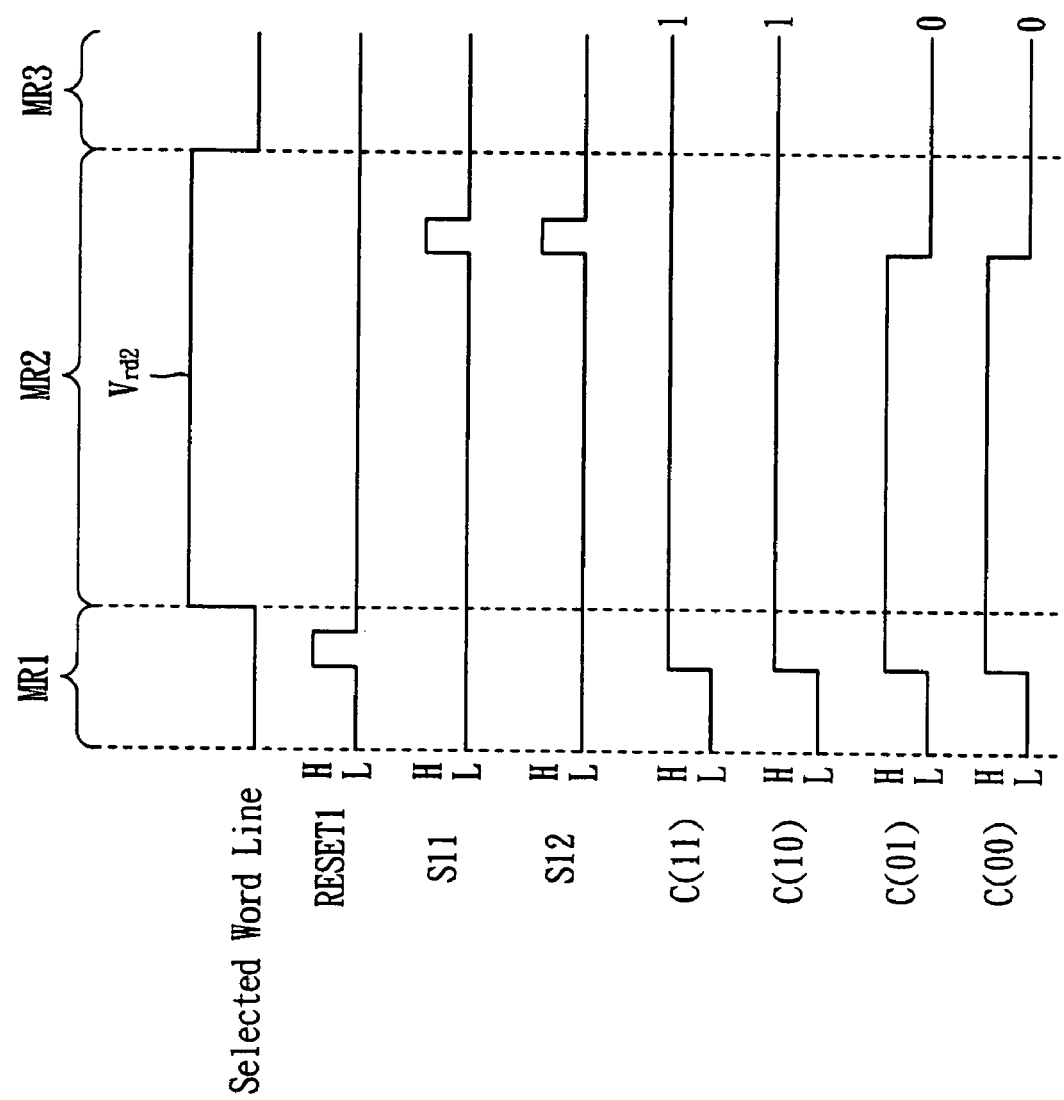
FIG. 9 shows the timing chart regarding the MSB read.

FIG. 9 shows the timing chart of the MSB read by one phase reading. In period MR1, the nodes C and D of the first latch circuit 51 are reset to a high state and a low state, respectively, by actuating the signal RESET1 to turn on the NMOS transistor T2. During the MSB read, only the first latch circuit 51 is used. In period MR2, the read voltage of $V_{rd2}$ (e.g., 1V) is applied to the selected word line to verify the state of the accessed memory cell. The first and second verify signals S11 and S12 are active to sense the state of the accessed memory cell since the second latch circuit 52 is not reset and the node A may be in a high or low state. If the accessed memory cell is in the (01) or (00) state, the node SO is in a high state and the node C is set to a low state by turning on the NMOS transistors T5, T3, and T4 (or T5, T6, and T7). If the accessed memory cell is in the (11) or (10) state, the node SO is in a low state and the node C remains in a high state. In period MR3, the state of the node C exhibits the MSB of the accessed memory cell in the (11), (10), (01), or (00) state.

Figure 10:
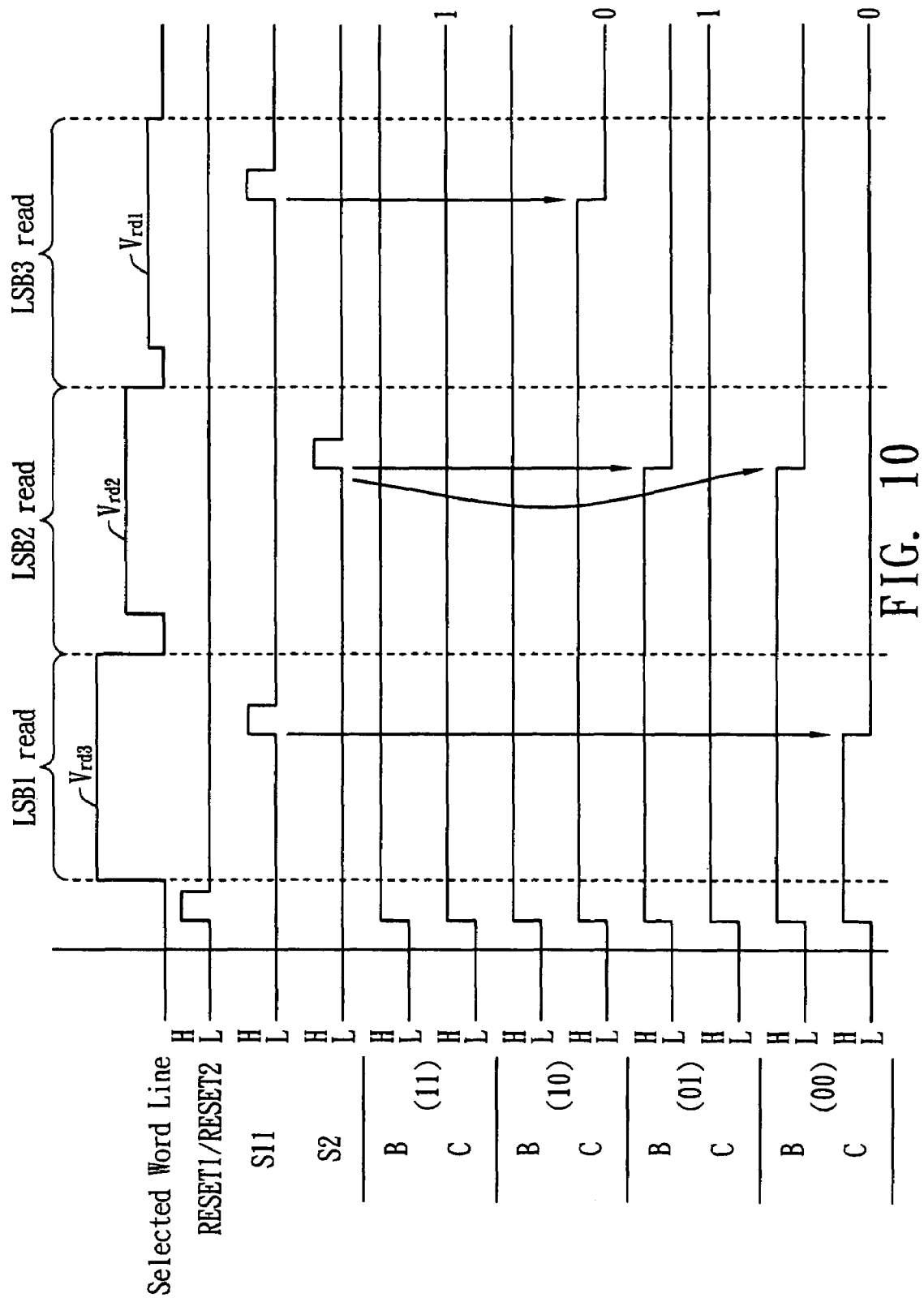
FIG. 10 shows the timing chart regarding the LSB read.

FIG. 10 shows the timing chart of the LSB read by a three-phase reading. The three-phase reading is used to detect the LSBs of the accessed memory cells, which comprises three phases, that is, the LSB1 read, the LSB2 read, and the LSB3 read. Referring to FIG. 10, the nodes A, B, C, and D are initially set to a low state, a high state, a high state, and a low state, respectively, by actuating the signals RESET1 and RESET2 to turn on the NMOS transistors T2 and T17. In the LSB1 read, the first latch circuit 51 is used. The read voltage of $V_{rd3}$ (e.g., 2V) is applied to the selected word line to distinguish the accessed memory cell in the (00) state from those in the (01), (10), and (11) states. The first verify signal S11 is active to sense the state of the accessed memory cell. If the accessed memory cell is in the (00) state, the node C is switched to a low state by turning on the NMOS transistors T5, T3, and T4. If the accessed memory cell is in the (11), (10), or (01) state, the node SO changes to a low state and the node C remains in a high state. In the LSB2 read, the second latch circuit 52 is used. The read voltage of $V_{rd2}$ (e.g., 1V) is applied to the selected word line to distinguish the accessed memory cell in the (10) or (11) state from that in the (01) or (00) state. The third verify signal S2 is active to sense the state of the accessed memory cell. If the accessed memory cell is in the (01) or (00) state, the node SO is in a high state and the node B switches to a low state. If the accessed memory cell is in the (11) or (10) state, the node SO is pulled down to a low state and the node B remains in a high state. In the LSB3 read, the first latch circuit 51 is used. The read voltage of $V_{rd1}$ (e.g., 0V) is applied to the selected word line to distinguish the accessed memory cell in the (11) state from those in the other states. The result of the LSB2 read is fed back to control the sensing in the LSB3 read. Again, the first verify signal S11 is used to sense the state of the accessed memory cell. The detection of the LSB of the accessed memory cell is summarized as follows. If the accessed memory cell is in the (00) state, the node C has already been set to a low state in the LSB1 read. If the accessed memory cell is in the (01) state, the node SO is in a high state in the LSB3 read, but the node B is set to a low state in the LSB2 read; therefore, the node C remains in a high state. If the accessed memory cell is in the (10) state, the node SO is in a high state in the LSB3 read and the node B is in a high state in the LSB1 read and the LSB2 read; therefore, the node C is set to a low state. If the accessed memory cell is in the (11) state, the node SO is in a low state in the LSB3 read and the node B is in a high state in the LSB1 read and the LSB2 read; therefore, the node C remains in a high state. As a result, the state of the node C is "0", "1", "0", and "1" when the accessed memory cell is in the (00), (01), (10), and (11) states, respectively. That is, the node C outputs as the LSB of the accessed memory cell. Each MSB and LSB of the memory cells is outputted by a latch 511 of the first latch circuit 51 (refer to FIG. 5).

Following the above detailed description of the methods for programming and reading a multi-level-cell NAND flash memory device, the technical characteristics are given as follows. The first verify signal S11 is used to verify the MSBs of the memory cells in the second state (refer to periods MV1 and MV2 in FIG. 7), and to verify the LSBs of the memory cells in the first state (refer to periods LV1 and LV3 in FIG. 8). The second verify signal S12 is used to verify the LSBs of the memory cells in the third state (refer to periods LV2 and LV4 in FIG. 8). The third verify signal S2 is used to read the LSBs of the memory cells in the second and the third states (refer to the LSB2 read and the LSB3 read in FIG. 10).

The above-described embodiments of the present invention are intended to be illustrative only. Numerous alternative embodiments may be devised by those skilled in the art without departing from the scope of the following claims.

What is claimed is:

1. A method for programming a NAND flash memory device having zero state memory cells, first state memory cells, second state memory cells and third state memory cells, each memory cell being associated with a first latch circuit and a second latch circuit, the method comprising the steps of:
   (a) programming the zero state memory cells, the first state memory cells, the second state memory cells and the third state memory cells to a zero state;
   (b) programming the second state memory cells from the zero state to a second state by switching the MSBs of the second state memory cells;
   (c) programming the first state memory cells from the zero state to a first state by switching the LSBs of the first state memory cells and simultaneously programming the third state memory cells from the second state to a third state by switching the LSBs of the third state memory cells; and
   verifying the second state memory cells between steps (b) and (c) by applying a first verify signal to the first latch circuit and applying a second program voltage to a selected word line associated with the second state memory cells.

2. The method for programming a NAND flash memory device of claim 1, further comprising the steps of:
   verifying the first state memory cells by applying the first verify signal to the first latch circuit and applying a first program voltage to a selected word line associated with the first state memory cells; and
   verifying the third state memory cells by applying a second verify signal to the first latch circuit and applying a third program voltage to a selected word line associated with the third state memory cells.

3. The method for programming a NAND flash memory device of claim 1, wherein the MSBs of the second state memory cells, the LSBs of the first state memory cells, and the LSBs of the third state memory cells are switched from a high state to a low state.

4. The method for programming a NAND flash memory device of claim 1, wherein a bit line power is applied to bit lines during programming the second state memory cells and during programming the first state memory cells.

5. The method for programming a NAND flash memory device of claim 4, wherein the bit line power is adjustable between a ground voltage and a source voltage to slow down the speed of programming the first state memory cells.

6. The method for programming a NAND flash memory device of claim 1, wherein the time of programming the first state memory cells is tuned to fit that of programming the third state memory cells.

7. The method for programming a NAND flash memory device of claim 1, wherein each of the MSBs of the memory cells in the zero state and in the second state is latched in the corresponding second latch circuit.

8. The method for programming a NAND flash memory device of claim 7, wherein the state of each of the MSBs of the memory cells in the zero state and in the second state is sensed by a third verify signal.

9. A method for reading a NAND flash memory device having zero state memory cells, first state memory cells, second state memory cells and third state memory cells, each memory cell being associated with a first latch circuit and a second latch circuit, the method comprising the steps of:

(a) reading the MSBs of the zero state memory cells, the first state memory cells, the second state memory cells, and the third state memory cells by applying a first verify signal and a second verify signal to the first latch circuit; and (b) reading the LSBs of the zero state memory cells, the first state memory cells, the second state memory cells, and the third state memory cells by applying the first verify signal to the first latch circuit and by applying a third verify signal to the second latch circuit, wherein Step (b) comprises the steps of:
  reading the LSBs of the third state memory cells by applying a third read voltage to selected word lines associated with the third state memory cells;
  reading the LSBs of the second state memory cells by applying a second read voltage to selected word lines associated with the second state memory cells; and
  reading the LSBs of the first state memory cells and the zero state memory cells by applying a first read voltage to selected word lines associated with the first state memory cells.

10. The method for reading a NAND flash memory device of claim 9, wherein each of the LSBs and the MSBs is outputted by a latch in the first latch circuit.

11. The method for reading a NAND flash memory device of claim 9, further comprising a step of resetting the first latch circuit before Step (a).

12. The method for reading a NAND flash memory device of claim 9, further comprising a step of resetting the first latch circuit and the second latch circuit between Steps (a) and (b).

13. A page buffer used in a NAND flash device having a plurality of memory cells, comprising:
  a first latch circuit verifying the memory cells by a first verify signal and a second verify signal;
  a second latch circuit reading the LSBs of the memory cells by a third verify signal;
  a bit line voltage supply circuit providing a bit line power to a selected bit line associated with the memory cells to be programmed;
  an input circuit receiving information to be programmed to the memory cells; and
  a precharge circuit precharging the selected bit line.

14. The page buffer of claim 13, further comprising a bit line selection circuit determining the selected bit line and a shielding bit line.

15. The page buffer of claim 13, wherein the first verify signal is used to verify the MSBs of the memory cells in a second state and to verify the LSBs of the memory cells in a first state.

16. The page buffer of claim 13, wherein the second verify signal is used to verify the LSBs of the memory cells in a third state.

17. The page buffer of claim 13, wherein the third verify signal is used to read the LSBs of the memory cells in a second state and in a third state.

18. The page buffer of claim 13, wherein the bit line power is adjustable from a ground voltage to a source voltage.

* * * * *